US011658095B2

(12) United States Patent
Lofgreen et al.

(10) Patent No.: US 11,658,095 B2
(45) Date of Patent: May 23, 2023

(54) BUMP INTEGRATED THERMOELECTRIC COOLER

(71) Applicant: Intel Corporation, Santa Clara, CA (US)

(72) Inventors: Kelly Lofgreen, Phoenix, AZ (US); Chandra Mohan Jha, Chandler, AZ (US); Krishna Vasanth Valavala, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 829 days.

(21) Appl. No.: 16/370,703

(22) Filed: Mar. 29, 2019

(65) Prior Publication Data

US 2020/0312742 A1 Oct. 1, 2020

(51) Int. Cl.
*H01L 23/38* (2006.01)
*H01L 23/48* (2006.01)
*H01L 23/00* (2006.01)
*H01L 25/18* (2023.01)
*H10N 10/82* (2023.01)
*H10N 10/01* (2023.01)

(52) U.S. Cl.
CPC ............ *H01L 23/38* (2013.01); *H01L 23/481* (2013.01); *H01L 24/09* (2013.01); *H01L 24/17* (2013.01); *H01L 25/18* (2013.01); *H10N 10/01* (2023.02); *H10N 10/82* (2023.02); *H01L 2924/1434* (2013.01)

(58) Field of Classification Search
CPC ....... H01L 23/38; H01L 23/481; H01L 24/09; H01L 24/17; H01L 25/18; H01L 35/10; H01L 35/34; H01L 2924/1434; H01L 24/13; H01L 24/14; H01L 24/16; H01L 2224/02372; H01L 2224/05124; H01L 2224/05139; H01L 2224/05144; H01L 2224/05147; H01L 2224/05548; H01L 2224/0557; H01L 2224/05571; H01L 2224/05639; H01L 2224/05644; H01L 2224/05647; H01L 2224/06181; H01L 2224/13024
See application file for complete search history.

(56) References Cited

U.S. PATENT DOCUMENTS 10,867,892 B1* 12/2020 Chang ................. H01L 25/0657
2006/0289050 A1* 12/2006 Alley ...................... H01L 35/10
136/203
2006/0289052 A1* 12/2006 O'Quinn ................ H01L 35/34
136/201

(Continued)

FOREIGN PATENT DOCUMENTS

CN 112352324 A * 2/2021 ............. H01L 35/04
WO WO-2007002337 A2 * 1/2007 ............. H01L 35/08

*Primary Examiner* — Mamadou L Diallo
(74) *Attorney, Agent, or Firm* — Essential Patents Group, LLP.

(57) ABSTRACT

An IC package, comprising a first IC component comprising a first interconnect on a first surface thereof; a second IC component comprising a second interconnect on a second surface thereof. The second component is above the first component, and the second surface is opposite the first surface. A thermoelectric cooling (TEC) device is between the first surface and the second surface. The TEC device is electrically coupled to the first interconnect and to the second interconnect.

15 Claims, 10 Drawing Sheets

(56) References Cited

U.S. PATENT DOCUMENTS

| | | | |
|---|---|---|---|
| 2007/0089773 A1* | 4/2007 | Koester | H01L 35/34 136/201 |
| 2007/0215194 A1* | 9/2007 | Bharathan | H01L 35/32 136/200 |
| 2009/0072385 A1* | 3/2009 | Alley | H01L 23/38 257/713 |
| 2012/0020027 A1* | 1/2012 | Dungan | H01L 25/0652 29/830 |
| 2013/0168798 A1* | 7/2013 | Chang | H01L 23/38 257/467 |
| 2014/0225248 A1* | 8/2014 | Henderson | H01L 23/5383 438/122 |
| 2016/0334845 A1* | 11/2016 | Mittal | H01L 23/34 |
| 2019/0074237 A1* | 3/2019 | Beauchemin | H01L 21/4882 |
| 2020/0006208 A1* | 1/2020 | Wu | H01L 23/04 |

* cited by examiner

BUMP INTEGRATED THERMOELECTRIC COOLER

BACKGROUND

Thermal management in integrated circuit (IC) packaging containing single or multiple integrated circuits (ICs) is becoming an increasingly important issue. Packaging for modern high-performance integrated circuits must contend with increasingly larger scale microelectronic circuit integration, including vertical integration of multiple IC devices within a package, such as "package-on-package" (PoP) IC packages. Smaller form factors are associated with increasingly higher power densities, having concomitant heat transfer challenges. High-performance IC devices, such as modern multi-core microprocessor and high-bandwidth memoies, frequently employ multiple IC devices within a single package having a flat or PoP architecture. Transient periods of high demand may activate one or more specific circuits localized within the IC device, engendering localized hot spots. For vertically-integrated IC devices (e.g. a PoP package), vertical transfer of heat away from the hot spot may be impeded by the inherent thermal resistance of the adjacent IC devices above and below the hot spot, particularly for IC devices lower in the stack. Lateral transfer of heat from the hot spot may also be impeded by high thermal resistance within the interconnect layer. Similar heat transfer limitations may also be found in single-level packages. Temperatures within the hot spot may reach or exceed 100° C., which may be an upper limit for the operating temperature of the IC device. Performance of the IC device is therefore limited as power delivered to the IC device must be throttled so the upper temperature limit is not exceeded.

While IC devices at the top of a vertically-integrated stack may be passively cooled by contact with a thermal solution, cooling of devices lower in the stack proves to be challenging. An effective solution for bottom- or mid-stack heat removal may enable higher power to flow into the device without exceeding maximum device temperature limits, increasing device performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
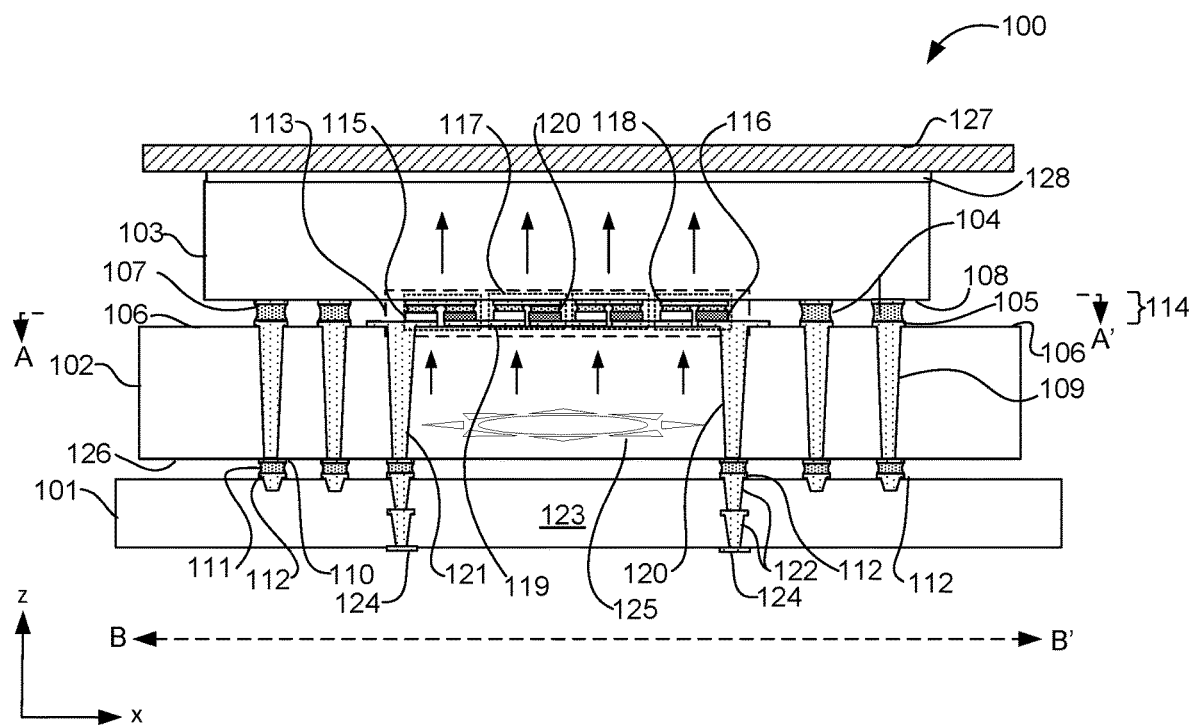
FIG. 1A illustrates a cross-sectional view of an IC package embodiment, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "die" generally refers to a carrier structure for an integrated circuit. The term "die" implies a single unit, to be distinguished from the plural "dice". Throughout this specification, however, the term "dies" will be used as the plural form of "die". A number of identical dies may be "singulated", or diced from a semiconductor wafer, such as a silicon wafer, by mechanical sawing or laser cutting.

Here, the term "package" generally refers to a structure including one or more integrated circuit dies bonded to a suitable substrate, such as a printed circuit board or embedded in a layered substrate (e.g., a bumpless build-up layer (BBUL) package). In common vernacular, an integrated circuit package may be referred to as a "chip", although the term "chip" technically refers to a die in the package. The one or more dies may be encapsulated for protection from the environment in a dielectric material, such as an epoxy resin or a ceramic composite, which is molded into a block. Alternatively, the package may be without encapsulation, allowing the one or more dies to be exposed. The substrate generally comprises electrical interconnects on its bottom surface, which may be a pin array for insertion into a socket, or electrical contact pads for permanent solder-bonding to a printed circuit board, such as a computer motherboard or daughterboard.

Here, the term "assembly" generally refers to an integrated circuit structure or device comprising one or more packages and other components. An example is a stack of separate integrated circuit packages, where one package may contain a microprocessor and a second package may contain a high-speed memory chip. The package stack may be attached to a common substrate and encapsulated, forming a self-contained package-on-package (PoP) device.

Here, the term "device" generally refers to an integrated circuit package comprising multiple dies, or to a single die.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

A package architecture incorporating a thermoelectric cooling device (e.g., a thermoelectric cooler, TEC) integrated within the interconnect layers between stacked IC devices or between IC device and substrate is disclosed. The TEC is integrated within the solder (bump) layer between devices or between substrate and device. According to some embodiments, the integrated TEC device may be integrated between stacked bare dies, between bare die and substrate, or between devices in stacked packages (e.g., PoP packages).

Accordingly, the TEC device is a thin structure, generally having a thickness that is less than the thickness of the interconnect layer between vertically adjacent devices. In some embodiments, the TEC has an overall thickness ranging between 5 microns and 50 microns. In some embodiments, the TEC device comprises thin-film thermoelectric elements integrated onto the first level interconnect pads (FLIs) of a package substrate. In some embodiments, the TEC device comprises thin-film thermoelectric elements integrated onto backside bond pads of an IC die or package intended for vertical integration in an IC stack. In some embodiments, the TEC device comprises thin-film thermoelectric elements integrated on land (front side) contacts of an IC die or package.

The disclosed TEC device may comprise thin film thermoelectric elements grown on the front-side pads and/or the back-side pads of vertically integrated IC device dies within a stack. In some embodiments, the TEC device comprises thin-film thermoelectric elements grown over a ball grid array.

Performance of IC devices such as central processing units (CPUs) or graphical processing units (GPUs) is often limited by the heat build-up within areas of the circuitry that are thermally isolated, creating transient hot spots. Thermally insulating materials may have a thermal conductivity k that is less than 0.1 W/mK. The transient nature of the hot spot may be a consequence of burst activity of the device, where sudden computational demands are placed on the device.

The increased activity may cause pronounced current draw of several amps by localized circuitry within in a small area of the device. As an example, some hot spots may be confined to area of 1 to 2 mm$^2$ within the active layer of the device, and may experience heat generation rates ranging from 1 to 10 watts due to power dissipation of the large current density. Rapid temperature rise within the hot spot may ensue during a burst, locally exceeding the temperature rating of the device, which is often in the neighborhood of 100° C. To prevent a thermal runaway caused by overheating of the transistors within the hot spot, power may be throttled to the chip by slowing down the clocking of the processor. Thus, to limit the temperature of the hot spot, the device performance is impaired by reducing the device's computational power.

IC packages having a stacked-die or package-on-package (PoP) architectures are particularly vulnerable to hot spot formation, as near-adiabatic conditions may be prevalent lower in the stack. In such architectures, devices higher in the stack may obstruct vertical heat transfer from bottom devices to a thermal solution above the stack. As an example, a PoP package may comprise several vertically-integrated die packages, each having a low-k dielectric substrate. A transient hot spot due to a burst may arise near-adiabatically in one of the devices at or near the bottom of the PoP stack. Lateral heat transfer may also be highly attenuated due to the presence of thermally-insulating underfill, further retarding heat dissipation from a hot spot.

In single-die or single-level packages with multiple dice, a thermal solution may be physically closer to the hot spot than in a stacked package. However, during bursts, the heat build-up may be so rapid that the passive heat transfer rate through the intervening host semiconductor material (e.g., silicon) may be too slow to allow sufficient heat transfer from the hot spot to the thermal solution. Penetration of heat to the substrate may also be impeded by an underfill if present. During bursts of high levels of activity, near adiabatic conditions may therefore be created when the transient power dissipation exceeds the heat transfer rate away from the hot spot.

The disclosed package architecture provides integrated inter-device TECs for active cooling adjacent to the hot spot. The inter-device TECs may be integrated within the interconnect layer between stacked devices (stacked dice or packages), or between a die and the substrate in a single-die package. In stacked-device architectures, an inter-device TEC may be integrated between a lower device and an upper device, where lower and upper refer to relative position within the vertical stack. Heat may be actively drawn from a hot spot developing in the active layer of the lower device and transferred to the upper device by the inter-device TEC.

By interfacing a cold junction of the TEC to the lower device producing the hot spot, vertical heat transfer through the lower device to the upper device may be enhanced. Active cooling by the vicinal TEC may draw away more heat from the hot spot than is possible by passive heat conduction through the lower device, as the TEC increases the temperature gradient by actively cooling the intervening material between the hot spot and the TEC. The TEC-induced increase in heat flow from the hot spot by the vicinal TEC results in more rapid cooling of the hot spot, lowering its temperature In single-die packages, an inter-device TEC may be integrated in the interconnect layer between the active layer of the die and the substrate. In some embodiments, a cold junction of the interlayer TEC may be interfaced with the active layer of the die. Heat may be actively drawn from the hot spot in the die and transferred vertically to the substrate below the die by the intervening TEC. While the substrate may comprise low-k dielectric materials, the inter-device TEC may provide more heat transfer than passive conduction through the host semiconductor of the die to a thermal solution on the upper side of the die. In some embodiments, a hot junction of the inter-device TEC is thermally coupled to metallization on or embedded within the substrate dielectric. The metallization may be thermally coupled to heat dissipation structures within the package, such as integrated heat spreader (IHS) walls.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a cross-sectional view of IC package 100, according to some embodiments of the disclosure.

Figure 1B:
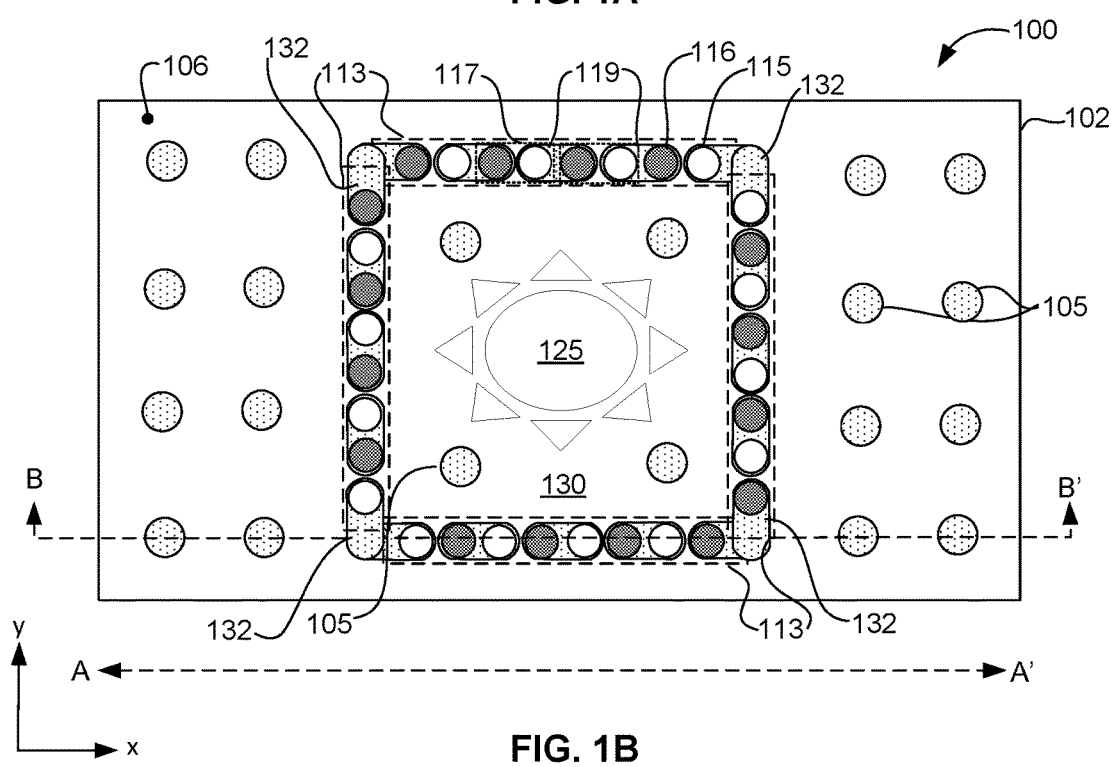
FIG. 1B illustrates a plan view in the x-y plane of the IC package embodiment of FIG. 1A, according to some embodiments of the disclosure.

The x-z plane in FIG. 1A is taken along cross-section cut line B-B' in FIG. 1B. IC package 100 is a stacked-die package, comprising substrate 101 coupled to a die stack comprising lower IC die 102 and upper IC die 103. Lower IC die 102 is electrically coupled to upper IC die 103 by solder joints 104 between bond pads 105 on backside 106 of lower IC die 102, and bond pads 107 on front side 108 of upper IC die 103. Bond pads 105 are extended vertically (in the z-direction) through lower IC die 102 by through-silicon vias (TSVs) 109 that interconnect backside bond pads 105 to front side bond pads 110. Bond pads 105 and 107 may be general purpose pads for routing data and power between devices. Solder joints 111 couple first level interconnects (FLIs) 112 on substrate 101 to front side bond pads 110. TSVs 109 may carry data signals or power from substrate 101 to upper IC die 103.

Thermoelectric cooler (TEC) 113 is delineated by the dashed outline in interconnect layer 114 between lower IC die 102 and upper IC die 103. TEC 113 comprises complementary thermoelectric elements 115 (white) and 116 (shaded), arranged as thermoelectric couples 117 (delineated by the dotted outlines) comprising paired thermoelectric elements 115 and 116. Each of thermoelectric elements 115 and 116 may comprise either a p-type semiconducting material or a n-type semiconducting material. Thermoelectric element pairs 115 and 116 in each of the thermoelectric couples 117 are electrically interconnected by traces 118 on front side 108 of upper IC die 103, forming a p-metal-n junction. Thermoelectric couples 117 are serially interconnected by traces 119 on backside 106 of lower IC die 102, electrically coupling adjacent thermoelectric elements 115 and 116 in neighboring thermoelectric couples 117. Thermoelectric couples 117 may be arranged so that thermoelectric elements 115 or 116 in neighboring thermoelectric couples 117 are adjacent, producing a 115/116-116/115 configuration.

Thermoelectric elements 115 and 116 may be layers comprising thermoelectric material that have a thickness (e.g., z-height) ranging between approximately 5 microns and 100 microns, for example. Underlying the thermoelectric layers are traces 119 comprising metals such as, but not limited to, copper, gold, silver or aluminum. Traces 119 may have thickness (z-height) ranging from approximately 15 to 50 microns, for example. Thermoelectric elements 115 and 116 may have any cross section in the x-y plane. In some embodiments, thermoelectric elements 115 and 116 are circular in cross section, having diameters ranging from approximately 20 to 1000 microns. Rectangular cross sections are another example.

Figure 3A:
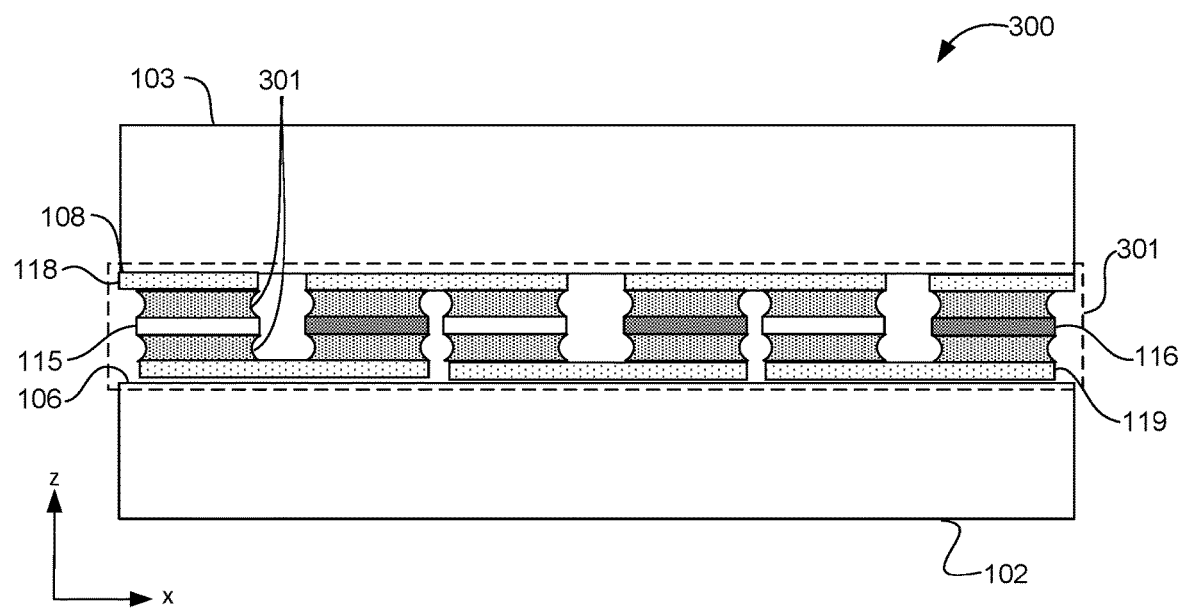
FIG. 3A illustrates an enlarged cross-sectional view in the x-z plane of an IC package embodiment, according to some embodiments of the disclosure.
Figure 3B:
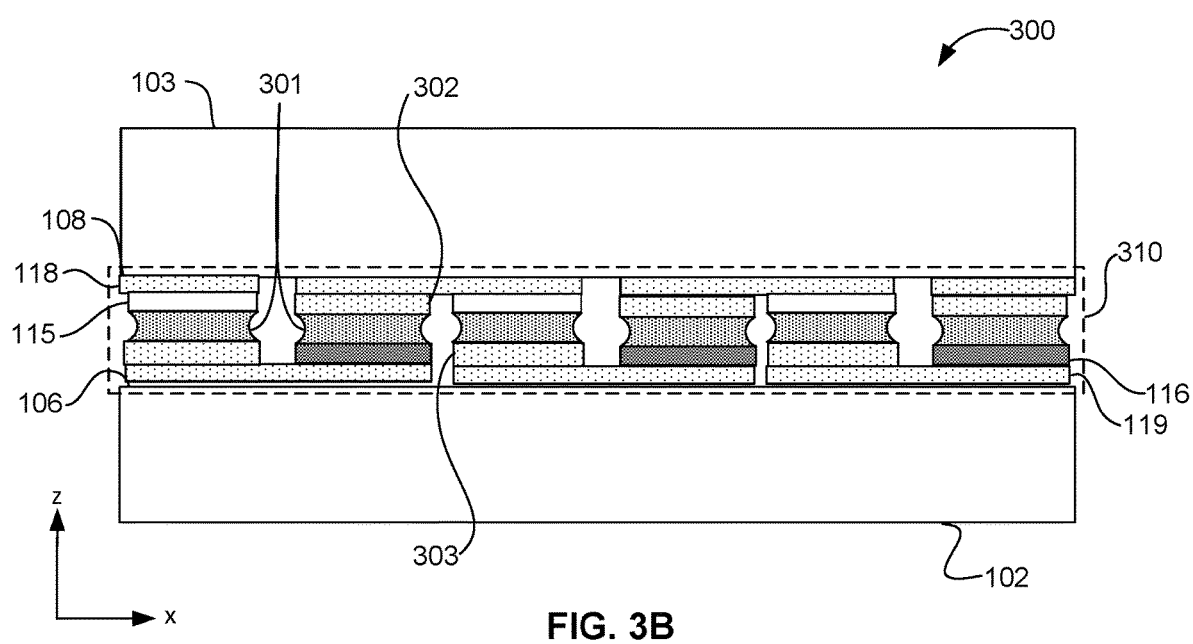
FIG. 3B illustrates an enlarged cross-sectional view in the x-z plane of the IC package embodiment of FIG. 3A, according to some embodiments of the disclosure.
Figure 3C:
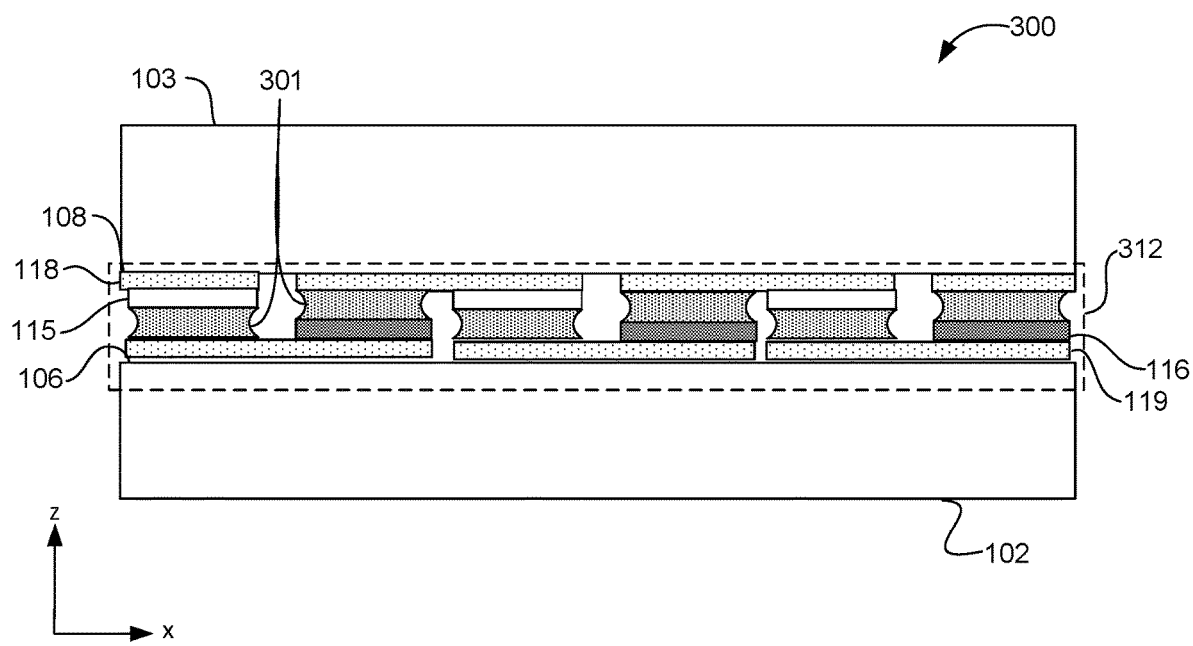
FIG. 3C illustrates an enlarged cross-sectional view in the x-z plane of an IC package embodiment, according to some embodiments of the disclosure.

In the illustrated embodiment, thermoelectric elements have a semiconductor/metal bond with traces 119, where the thermoelectric material is bonded directly to the metal material of traces 119 by atomic bonds. In some embodiments, the configuration is reversed, with thermoelectric elements 115 and 116 atomically bonded to the metal traces 118 on upper IC die 103 and solder-bonded to backside trace 119. In some embodiments, thermoelectric elements 115 and 116 are solder bonded to both traces 118 and 119. In some embodiments, thermoelectric elements are alternately soldered to traces 118 and 119. Examples of the three embodiments just described are shown in FIGS. 3A-3C.

In some embodiments, the thermoelectric material is a doped semiconducting material, having either p-type or n-type conductivity. Suitable thermoelectric materials include, but are not limited to, bismuth chalcogenides, such as bismuth telluride ($Bi_2Te_3$) and bismuth selenide ($Bi_2Se_3$), antimony chalcogenides such as antimony telluride ($Sb_2Te_3$); bismuth-antimony chalcogenide alloys, such as p-type $Bi_xSb_{(2-x)}Te_3$ and n-type $Bi_2Te_{(1-x)}Se_x$; lead chalcogenides such as thallium-doped lead telluride (PbTe) and lead chalcogenide alloys such as p-type $PbTe_{(1-x)}Se_x$, and n-type $Pb_{(1-x)}Sn_xTe$. Suitable thermoelectric materials may further include clathrates such as $Ba_8Ga_{16}Ge_{30}$, or $Ba_8Ga_{16}S_{130}$ and $Ba_8Ga_{16}Al_3Ge_{27}$; alloys of silicon-germanium ($Si_xGe_{(1-x)}$) such as $Si_{0.8}Ge_{0.2}$. Suitable thermoelectric materials may further include Skutterudite compounds such as (Co, Ni or Fe)(P, Sb or As) skutterudites, and rare earth-filled skutterudites such as $Ir_4XGe_3Sb_9$, where X is La, Nd or Sm. Suitable thermoelectric materials may further include transition metal oxides such as sodium cobaltite ($Na_xCoO$) and sodium cobaltate ($Na_{0.8}CoO_2$), zinc oxide (ZnO), manganese oxide ($MnO_2$) and niobium oxide ($NbO_2$), half Huesler compounds including NbFeSb, NbCoSn, VFeSb, strontium titanate/strontium oxide (SrTiO$_3$/SrO) Ruddlesden-Popper phase compounds. Suitable thermoelectric materials may further include amorphous systems such as Cu—Ge—Te, In—Ga—Zn—O, Zr—Ni—Sn, Si—Au and Ti—Pb—V—O. Other suitable thermoelectric materials are also possible. N-type and p-type doping of the materials may be done by introduction of heteroatoms or by alloy composition.

In the illustrated embodiment, TEC 113 comprises four thermoelectric couples 117 interconnected in series by traces 119. It will be understood that the number of thermoelectric couples 117 shown in the figure is not meant to be limiting, and that any number of thermoelectric couples may be employed to form TEC 113. In some embodiments, TEC 113 is a single thermoelectric couple. Terminal thermoelectric couples 117 are electrically coupled to substrate 101 by TSVs 121, which may couple power to TEC 113 from substrate 101. Power may be coupled to TEC 113 through substrate vias 122 that extend through dielectric 123 of substrate 101. Substrate vias 121 may interconnect land-side bond pads 124 to FLI bond pads 112. Land-side bond pads 124 may be solder bonded to a printed circuit board (not shown), which may couple a power source/controller (not shown) to TEC 113.

An operational illustration of TEC 113 is shown by localization of hot spot 125 represented in the figure by heat symbol near front side 126 of bottom die 102. The upward-pointing arrows indicate the flow heat through the host semiconductor material of lower IC die 102, from hot spot 125 to backside 106. Heat reaching backside 106 is pumped from hot spot 125 to upper IC die 103 by the Peltier action of TEC 113. The majority carriers (e.g., electrons in n-type material and holes in p-type material) within the thermoelectric material carry heat from one junction to the other. Directionality of heat pumping action of TEC 113 is dependent on the direction of majority carrier currents within the thermoelectric elements 115 and 116. Direction of the currents is dependent on the polarity of voltage applied to the terminal elements. Both types of majority carriers flow in parallel in their respective elements.

Majority carriers carry heat away from one metal/semiconductor junction, cooling it, and deliver it to the metal/semiconductor junction on the opposite side of the thermoelectric element, warming it. The cooled junction is known as the cold junction, whereas the warmed junction is known as the hot junction. The polarity of the voltage applied to TSVs 121 and coupled to terminal thermoelectric elements (e.g., thermoelectric elements 115 and 116 on the left end and right end of TEC 113, respectively) determine the direction of heat flow. As an example, forward biasing the TEC 113 by applying a positive voltage to thermal thermoelectric element 115 (p-type) and a negative voltage to terminal element 116 (n-type) may cause heat flow from lower IC die 102 to upper IC die 103. Reverse biasing TEC 113 may reverse the pumping direction, causing heat flow from upper IC die 103 to lower IC die 102.

Heat may be actively pumped from hot spot 125 to the cold junction formed of TEC 113 at backside traces 119. Heat from hot spot 125 is pumped across thermoelectric elements 115 and 116 to the hot junction formed at front-side traces 118. Upper die 103 may have a lower average temperature than the temperature of front-side traces 118, and heat may passively flow into upper IC die 103 and to a thermal solution 127 in contact with die 103. The direction of heat flow is indicated by the upward-pointing arrows in the figure. In some embodiments, thermal solution 127 is an integrated heat spreader (IHS). In some embodiments, thermal interface material (TIM) 128 is a thermally conductive layer between upper IC die 103 and thermal solution 127. TEC 113 may enhance heat flow away from hot spot 125 by maintaining a temperature gradient between hot spot 125 and backside 106 of lower IC die 102. TEC 113 may cool the host semiconductor material above hot spot 125 to augment and maintain a relatively large temperature gradient. TEC 113 also bridges the gap between lower IC die 102 and upper IC die 103, which may be filled by air or an underfill material (not shown) that has low thermal conductivity.

Many thermoelectric materials that may be employed by TEC 113 may have relatively low thermal conductivity (k), but the thermal conductivity of thermoelectric materials (e.g., k>1 W/mK that may be employed in TEC 113 may higher than air (e.g., k~0.02 W/mK) or an underfill material (e.g., k~0.3 W/mK) within interface 104. When not in operation, TEC 113 may not impede passive heat flow between devices, as its overall thermal conductivity may be at least approximately the same as the overall thermal conductivity of interconnect layer 114.

FIG. 1B illustrates a plan view in the x-y plane of IC package 100, according to some embodiments of the disclosure.

The view of FIG. 1B is taken above backside 106 of lower IC die 102 in FIG. 1A, shown by section line A-A' extending through thermoelectric elements 115 and 116. FIG. 1B shows an exemplary pattern of backside bond pads 105 and thermoelectric elements 115 and 116. Region 130, comprising integrated circuitry (not shown) where hot spot 125 may develop when the device is operated in burst mode, is flanked by four TECs 113 extending along its perimeter in the illustrated embodiment. Thermoelectric couples 117, delineated by the dotted outlines, are interconnected by backside traces 119. Hot spot 125 may develop within region 130 near front side 126 (FIG. 1A) when the device is operated in burst mode.

The arrangement of TECs 113 shown in the illustrated embodiment is peripheral to integrated circuitry (not shown) that may be present within region 130. TECs 113 may be powered to absorb a large portion of heat generated by active integrated circuitry within region 130. Heat may flow from the interior of region 130 along thermal gradients leading toward TECs 113, as described above. Thermal gradients in the x and y directions may be established by active heat pumping of TECs 113, cooling the periphery of region 130. TECs 113 may absorb heat reaching the cold junctions formed at traces 119, and pump it vertically (in the z-direction) to upper IC die 103, where the rejected heat may flow to IHS 127 (shown in FIG. 1A).

In the illustrated embodiment, terminal ends of TECs 113 having the same polarity may be interconnected by corner traces 132 that couple common power polarities to the terminal thermoelectric elements. As shown in FIG. 1B, adjacent TECs 113 terminated by thermoelectric elements 115 at one end are and interconnected by corner traces 132 common to both TECs. Similarly for thermoelectric element 116 terminations, corner traces 132 interconnect adjacent TECs 113 at the opposite ends. Voltage of a particular polarity may be coupled at opposite corner traces 132 (e.g., positive voltage applied to thermoelectric elements 115 at opposing corners and negative voltage or ground applied to thermoelectric elements 116 at alternate corners) to power TECs 113.

Figure 1C:
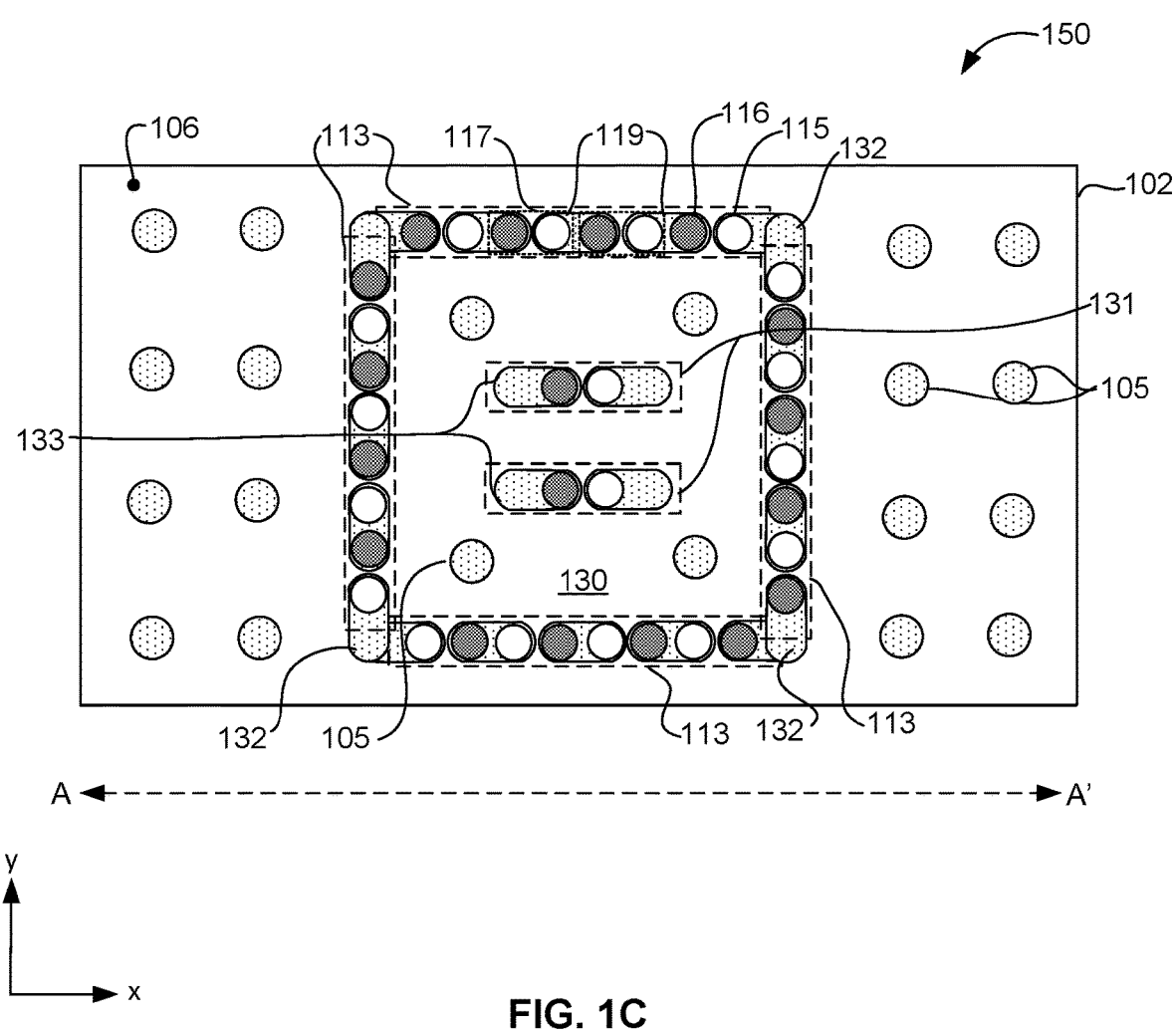
FIG. 1C illustrates a plan view in the x-y plane of an IC package embodiment, according to some embodiments of the disclosure.

FIG. 1C illustrates a plan view in the x-y plane of IC package 150, according to some embodiments of the disclosure.

The view of FIG. 1C is taken along x-y plane A-A' above backside 106 of lower IC die 102 in FIG. 1A, shown by the section line extending through thermoelectric elements 115 and 116. In some embodiments, as shown in FIG. 1C, TECs 131 (having fewer thermoelectric elements) may be interspersed within the integrated circuitry of region 130 to be in closer proximity with heat-generating sections of integrated circuitry or groups of components, supplementing TECs 113 at the periphery of region 130. TECs 131 may be powered separately from TECs 113.

Figure 2:
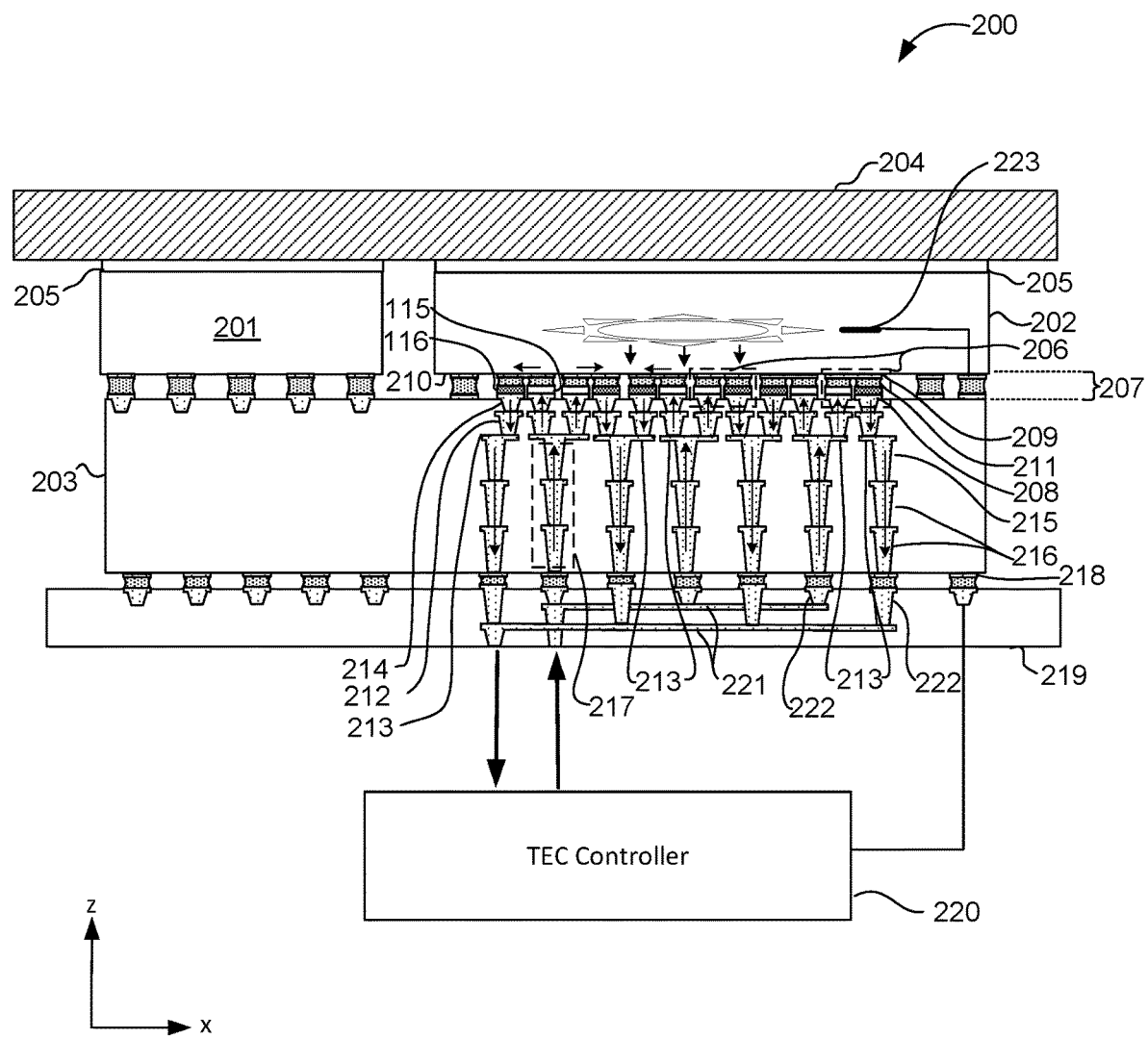
FIG. 2 illustrates a cross-sectional view in the x-z plane of an IC package embodiment, according to some embodiments of the disclosure.

FIG. 2 illustrates a cross-sectional view in the x-z plane of IC package 200, according to some embodiments of the disclosure.

IC package 200 is a single-level, multi-die package, comprising IC dies 201 and 202, coupled directly to substrate 203. IC dies 201 and 202 are both thermally coupled to IHS 204 through TIM 205. Multiple TECs 206, delineated by the dashed enclosures, are within interconnect layer 207 between IC die 202 and substrate 203. TECs 206 comprise single thermoelectric couples (e.g., thermoelectric couples 117 in FIG. 1A), comprising thermoelectric element pairs 115 and 116 bonded to FLIs 208 on substrate 203. FLIs 208 and other metallization structures, such as front side traces 209 on front side 210 of IC die 202, may comprise metals such as, but not limited to, copper, gold or silver.

In some embodiments, thermoelectric elements 115 and 116 are solder-bonded to FLIs 208. In the illustrated embodiment, thermoelectric elements 115 and 116 are coupled to FLIs 208 by atomic bonds with the metal material of the FLI below, and coupled to traces 209 above (on front side 210 of IC die 202) by solder joints 211. Traces 209 join together thermoelectric elements 115 and 116 overhead as thermoelectric couples (e.g., thermoelectric couples 117 in FIG. 1A). The junction between the thermoelectric elements is a p-metal-n junction, and drives the Peltier effect thermodynamically.

In the illustrated embodiment, thermoelectric elements 115 and 116 are electrically and thermally coupled to individual FLIs 208. In some embodiments, FLIs 208 are bond pads that comprise a metal such as, but not limited to, copper, gold or silver. In some embodiments, thermoelectric elements 115 and 116 are a film comprising a thermoelectric material, as described above, formed on FLIs 208. The thermoelectric material is in direct contact with the metal material of FLIs 208, and form a semiconductor/metal junction between them. The semiconductor/metal junction comprises the semiconductor material of the thermoelectric element joined directly to the metal of the FLI by atomic bonds. In some embodiments, thermoelectric elements 115 and 116 range in thickness between 5 to 100 microns and a diameter that ranges between 20 and 1000 microns.

Electrical and thermal connections to thermoelectric elements 115 and 116 are made by vias 212 extending above buried traces 213 to FLI vias 214. Vias 215 extend below buried traces 213 and couple to lower vias 216. Buried traces 213 extend laterally from vias 215, spanning between neighboring TECs 206. In the illustrated embodiment, TECs 206 are arranged so that similar thermoelectric elements from neighboring TECs 206 are juxtaposed and electrically coupled to a common buried trace 213.

In the illustrated embodiment, power is routed to individual TECs 206 in parallel, by via stacks 217 comprising vias 215 and 216. Via stacks 217 are electrically coupled to land-side interconnects 218 through vias 216. Power coupled to land-side interconnects 218 from PCB 219 may be distributed to thermoelectric elements coupled to a common via stack 117.

As an illustrative example, current circulation though via stacks 217 and TECs 206, is indicted by the vertical arrows drawn through via stacks 217. Arrows show the bifurcation of current flowing into adjacent thermoelectric elements 115 from a common via stack 217, and recombination of return current flowing out of adjacent thermoelectric elements 116 into a common via stack 217.

In the illustrated embodiment, IC package 200 is surface-mounted on PCB 219. Land-side interconnects 218 on substrate 203 couple via stacks 217 to PCB 219. TEC controller 220 may couple to via stacks 217 through PCB 219. In the illustrated embodiment, PCB 219 is an exemplary multi-level printed circuit board comprising buried power rails 221 coupled to IC package 200 through via interconnects 222 extending vertically (in the z-direction) through PCB 219.

TEC controller 220 may be coupled to one or more temperature sensors, such as integrated temperature sensor 223. In some embodiments, temperature sensor 223 is an integrated component in the active layer of IC die 202. Temperature sensor 223 may be part of a feedback loop of TEC controller 220. Temperature sensor 223 may sense temperature rise within IC die 202 and cause TEC controller 220 to activate TECs 206 when the rate of temperature rise exceeds a rate value programmed in TEC controller 220, or the temperature sensed by temperature sensor 223 exceeds a set point value programmed in TEC controller 220.

During device operation, heat flow from hot spot 224 may be actively directed into substrate 203 by TECs 206 when power is applied from TEC controller 220. Downward pointing arrows below hot spot 224 indicate heat flow along a temperature gradient that may develop by active cooling of front side 210 of IC die 202 by TECs 206. Heat may be pumped by TECs 206 into the network of substrate metallization comprising via stacks 217 and buried traces, such as buried traces 213, where dispersion of the rejected heat into substrate 203 is facilitated by the buried substrate metallization. In some embodiments, specialized metallization structures, such as buried thermal traces, may be included for lateral transport of heat to package-integrated heat dissipation structures, such as IHS 204, above substrate 203.

FIG. 3A illustrates an enlarged cross-sectional view in the x-z plane of IC package 300 comprising TEC 301, according to some embodiments of the disclosure.

IC package 300 has a stacked-die architecture, comprising intra-layer TEC 301 between lower IC die 102 and upper IC die 103. It will be understood that in some embodiments, substrate 103 may be substituted for lower IC die 102 without modifying the described embodiment of TEC 301. In the enlarged view, a portion of TEC 301 is shown. Thermoelectric elements 115 and 116 are between solder joints 301. Solder joints 301 electrically couple thermoelectric elements to traces 118 and 119 on front side 108 of upper IC die 103 and backside 106 of lower IC die 102, respectively. Prior to assembly of IC package 300, TEC 301 may be formed on IC dies 102 and 103 having ball grid arrays (BGA) on backside 106 and front side 108, respectively. A ball grid array is an array of solder bumps or balls formed on bond pads on an IC die. Thermoelectric elements 115 and 116 may be formed over the ball grid array.

Thermoelectric elements 115 and 116 may comprise thermoelectric materials enumerated above that are compatible with solder bonding. In some embodiments, thermoelectric elements 115 and 116 range in thickness between approximately 2 and 20 microns. Thermoelectric elements 115 and 116 may have dimensions that are commensurate with BGA pitches. As an example, thermoelectric elements 115 and 116 may have diameters ranging between approximately 20 microns and 500 microns to accommodate BGA pitches of 50 to over 500 microns.

FIG. 3B illustrates an enlarged cross-sectional view in the x-z plane of IC package 300 comprising TEC 310, according to some embodiments of the disclosure.

TEC 310 comprises thermoelectric elements 115 and 116 in different planes, where thermoelectric elements 115 and 116 are respectively coupled to traces 118 on upper IC die 103 and 119 on lower IC die 102. Again, it will be understood that in some embodiments, substrate 103 may be substituted for lower IC die 102 without modifying the described embodiment of TEC 310. Each thermoelectric element is solder bonded to traces on the opposing IC die (e.g., thermoelectric elements 115 solder-bonded to traces 119 on lower IC die 102). In the illustrated embodiment, thermoelectric elements 115 are atomically bonded to dummy elements 302 on traces 118 on front side 108 of upper IC die 103 and solder-bonded to dummy elements 303 on traces 119 on backside 106 of lower IC die 102. Reciprocally, thermoelectric elements 116 are atomically bonded to traces 119 below and solder-bonded to dummy elements on traces 118 above. Dummy elements 302 and 303 extend over traces 118 and 119, respectively. In some embodiments, dummy elements have a z-height that is substantially the same as the z-height (e.g., thickness) of adjacent thermoelectric elements.

Dummy elements 302 and 303 may facilitate fabrication of TEC 310. During bonding of upper IC die 103 to lower IC die 102 (e.g., flip-chip bonding) traces 118 or 119 may be solder bumped with solder balls having uniform dimensions. By having substantially uniform z-heights, both dummy elements and thermoelectric elements are level, enabling substantially uniform z-height of solder balls over the die surface. As an example, solder bumps may have a z-height of 20 to 50 microns. A 10-micron difference in z-height between a thermoelectric element and an adjacent bare pad may be significant. Resulting solder joints (e.g., solder joints 301) may be non-uniform and form poor interconnections. Dummy elements 302 and 303 provide a surface substantially equal in z-height to that of thermoelectric elements, so that substantially all solder joints 302 and 303 may be within acceptable manufacturing tolerances. For embodiments where differences in z-height between a thermoelectric element and an adjacent bare pad are insignificant in an interconnect process, dummy elements may be absent.

FIG. 3C illustrates an enlarged cross-sectional view in the x-z plane of IC package 300 comprising TEC 312, according to some embodiments of the disclosure.

In some embodiments, TEC 312 is structurally similar to TEC 310 described above and shown in FIG. 3B, with the exception of dummy elements 302 and 303. TEC 312 also comprises thermoelectric elements 115 and 116 in different planes, where thermoelectric elements 115 and 116 are respectively coupled to traces 118 on upper IC die 103, and to traces 119 on lower IC die 102. Each thermoelectric element is solder bonded to traces on the opposing IC die (e.g., thermoelectric elements 115 solder-bonded to traces 119 on lower IC die 102). In the illustrated embodiment, thermoelectric elements 115 are atomically bonded to traces 118 on upper IC die 103 and solder-bonded to directly to traces 119 on lower IC die 102. In a reciprocal manner, thermoelectric elements 116 are atomically bonded to traces 119 below and solder-bonded to traces 118 above. Dummy elements are not present on traces 118 or 119. In the absence of dummy elements, solder joints 301 may accommodate different z-heights through simply through reflow of substantially uniformly-sized solder balls, or solder balls of different diameters may be employed during manufacture.

FIGS. 4A-4K illustrate an exemplary method of manufacture of IC package 100, according to some embodiments of the disclosure.

Figure 4A:
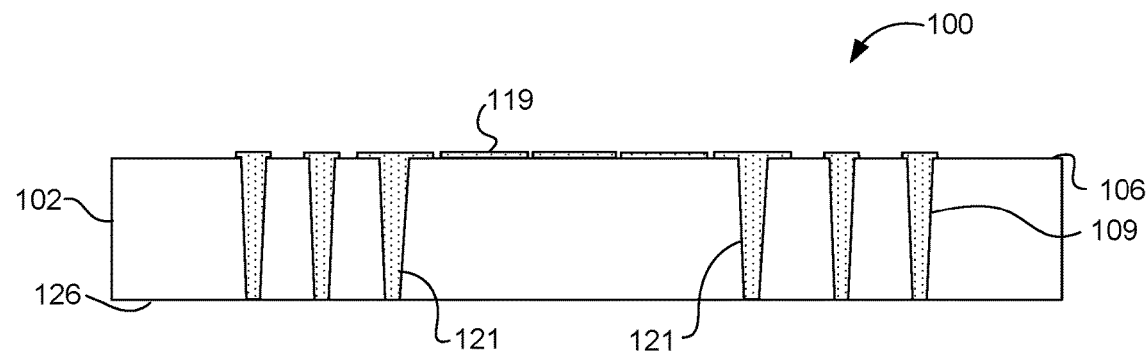
FIGS. 4A-4K illustrate an exemplary method of manufacture of an IC package, according to some embodiments of the disclosure.

In the operation shown in FIG. 4A, 1 lower IC die 102 is received. Lower IC die 102 comprises TSVs 109 coupled to bond pads 105, and TSVs 121 coupled to traces 119 on backside 106 of lower IC die 102. Bond pads 110 on front side 126 of lower IC die 102 are solder-bonded to FLIs 112 on the die side of substrate 101 through solder joints 111. In some embodiments, lower IC die 102 is flip-chip bonded to substrate 101. Solder joints 111 may result from reflow of solder bumps deposited over front-side bond pads 110 in a previous assembly operation.

Substrate vias 122 extend though substrate dielectric 123, interconnecting FLIs 112 on the die side of substrate 122 to land side pads 124. Traces 119 may be interconnected to land side pads 124 through TSVs 121 and substrate vias 122.

Figure 4B:
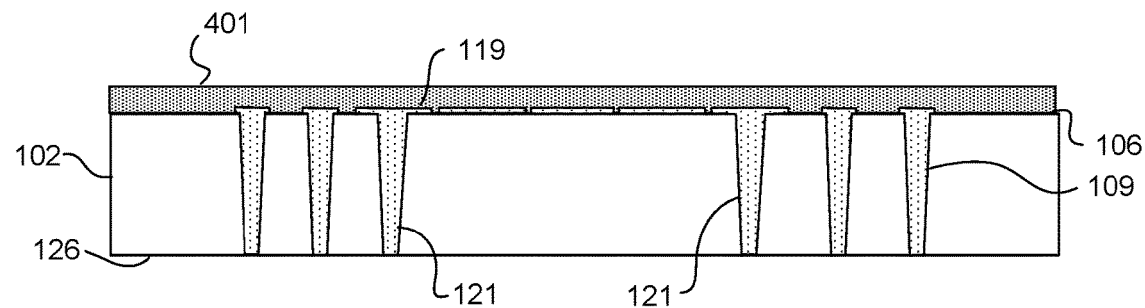

In the operation shown in FIG. 4B, layer 401 comprising a first thermoelectric material is deposited over die backside 106. A suitable thermoelectric material may be selected from the thermoelectric materials listed above to form. For example, a n-type bismuth telluride may be chosen to form layer 401. In some embodiments, layer 401 is electroplated onto backside 106. Formation of a thin seed layer (e.g., 100 nm) comprising a metal such as, but not limited to, copper or gold may be sputter-deposited or vacuum-evaporated onto backside 106 preceding the electroplating operation. In some embodiments, layer 401 may be formed by chemical vapor deposition (e.g., metal-organic chemical vapor deposition, MOCVD). In some embodiments, layer 401 has a thickness ranging from 2 microns to 10 microns. In some embodiments, layer 401 is screen printed by spreading a paste of the thermoelectric material over a mask layer (not shown).

Figure 4C:
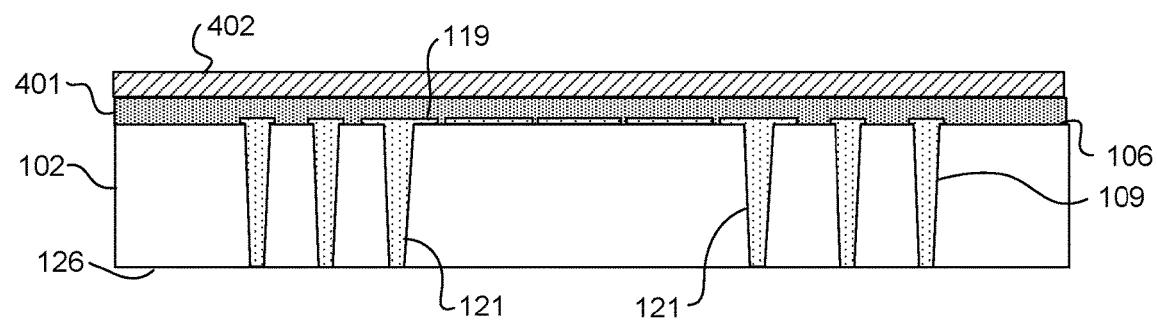

In the operation shown in FIG. 4C, photoresist film 402 is formed over layer 401. In some embodiments, photoresist film 402 is spin-coated onto layer 401. In some embodiments, photoresist film is spray-coated onto layer 401. In some embodiments, photoresist film is a dry film resist that is laminated over layer 401. Photoresist film 402 may comprise a negative-tone or positive-tone photoresist material for patterning through a photolithographic process.

Figure 4D:
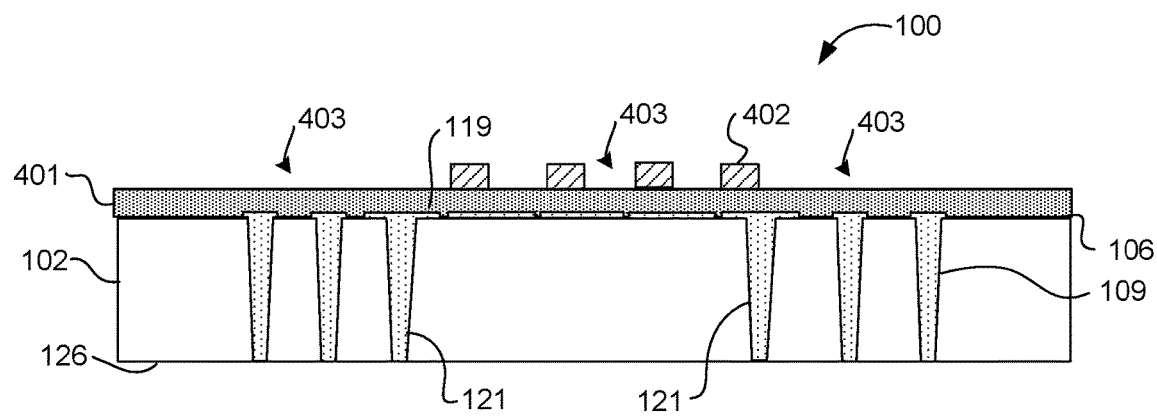

In the operation shown in FIG. 4D, photoresist film 402 is patterned to form openings 403, exposing portions of layer 401 for chemical etching in a subsequent operation. Where photoresist film 402 remains, the thermoelectric material in layer 401 is protected from chemical attack. The shape of openings 403 may be lithographically defined through a photomask and exposure to ultraviolet light. A number of suitable photolithographic procedures are possible.

Figure 4E:
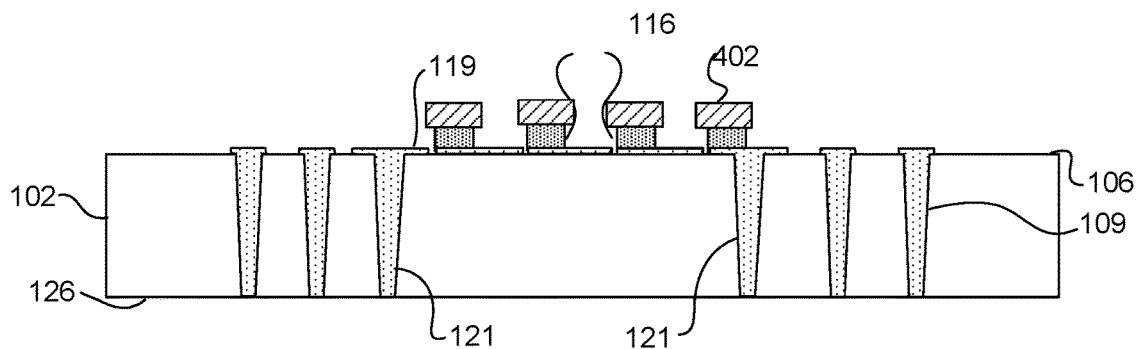

In the operation shown in FIG. 4E, thermoelectric elements 116 are formed by a chemical etch process that removes the thermoelectric material where not protected by photoresist layer 402. A wet chemical etch may be employed, where a suitable acid or base etchant may be chosen. Remaining photoresist layer 402 may overhang thermoelectric elements 116 to allow separation from thermoelectric elements 115 formed in the subsequent operation shown in FIG. 4F.

Figure 4F:
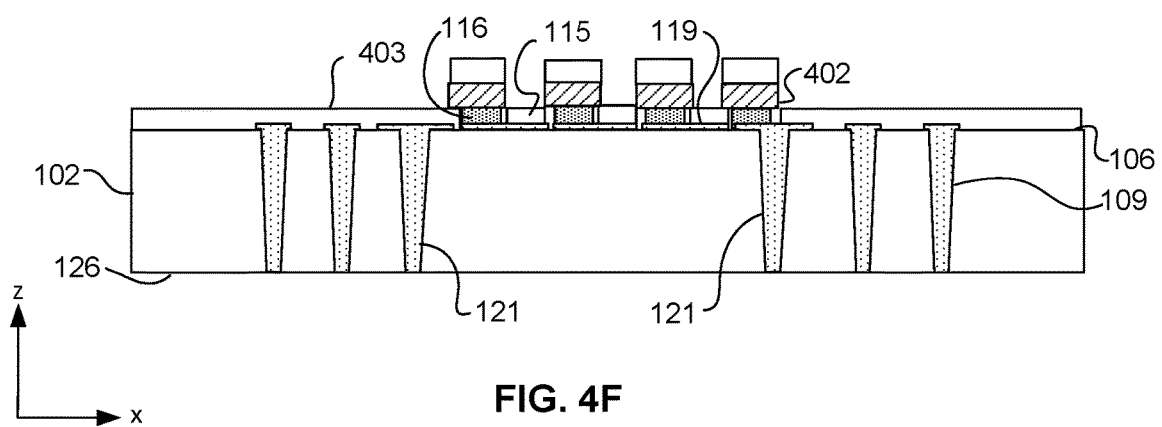

In the operation shown in FIG. 4F, layer 403 comprising a second thermoelectric material is deposited over backside 106, covering remaining portions of photoresist layer 402 and openings between thermoelectric elements 116 on traces 119. As for the first thermoelectric material in layer 401 formed in the operation shown in FIG. 4B, layer 403 may be electroplated or deposited by a chemical vapor deposition process. Alternatively, layer 403 may be screen printed. A suitable material may be the same as the first thermoelectric material, but of opposite charge type. As an example, layer 403 may comprise a p-type bismuth telluride.

Portions of layer 403 may form thermoelectric elements 115 over traces 119 within spaces adjacent to thermoelectric elements 116. Overhanging portions of photoresist layer 402 enable a gap between thermoelectric elements 115 and 116 for physical separation between the thermoelectric elements.

Figure 4G:
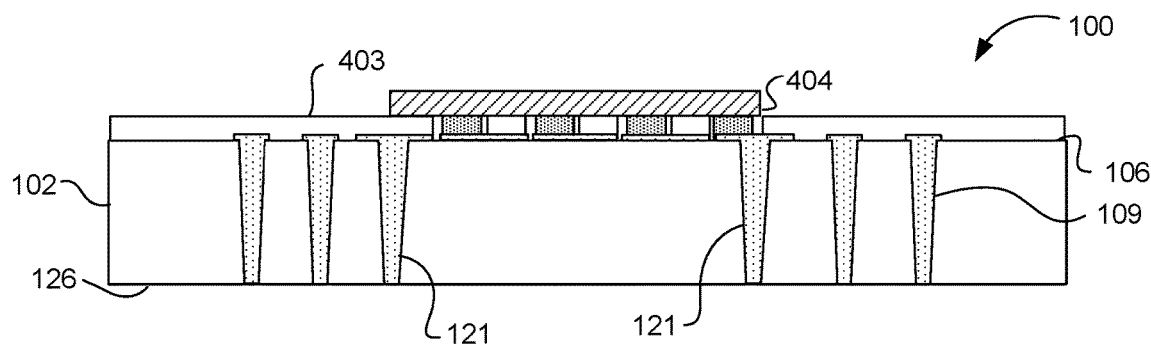

In the operation shown in FIG. 4G, remaining photoresist layer 402 is stripped and replaced by photoresist layer 404. In some embodiments, photoresist layer 404 comprises the same photoresist material as photoresist layer 402. Photoresist layer 404 is patterned to leave a portion covering thermoelectric elements 115 and 116 to protect these from chemical attack.

Figure 4H:
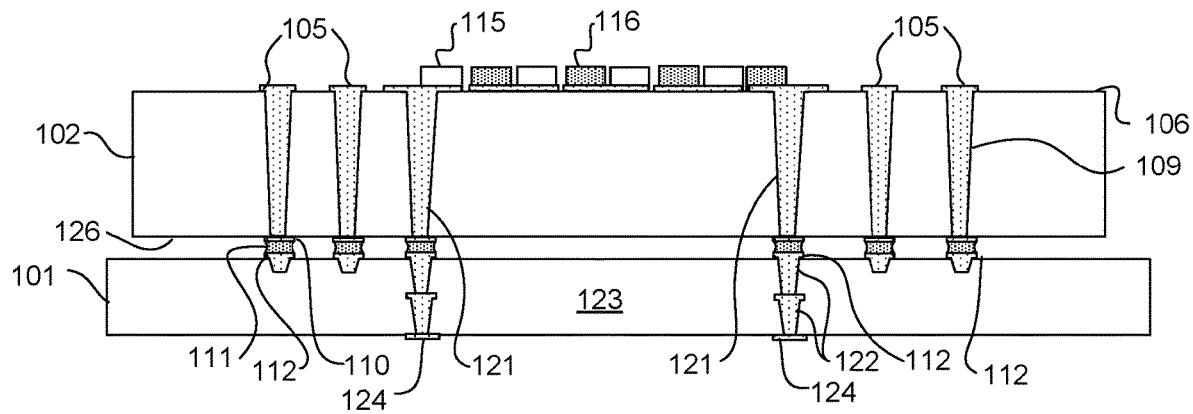

In the operation shown in FIG. 4H, layer 403 is etched where exposed. A suitable etch process as described for operation shown in FIG. 4E may be employed. The etch removes layer 403 everywhere, exposing bond pads 105 on die backside 106. Photoresist layer 404 protects thermoelectric elements 115 and 116. After the etch operation, remaining photoresist layer 404 is stripped, leaving thermoelectric elements intact. The remaining thermoelectric elements are the basis for formation of the TEC structure (e.g., TEC 113 in FIG. 1A).

Substrate 101 may be attached in this operation, where lower IC die 102 maybe flip-chip bonded to substrate 101.

Figure 4I:
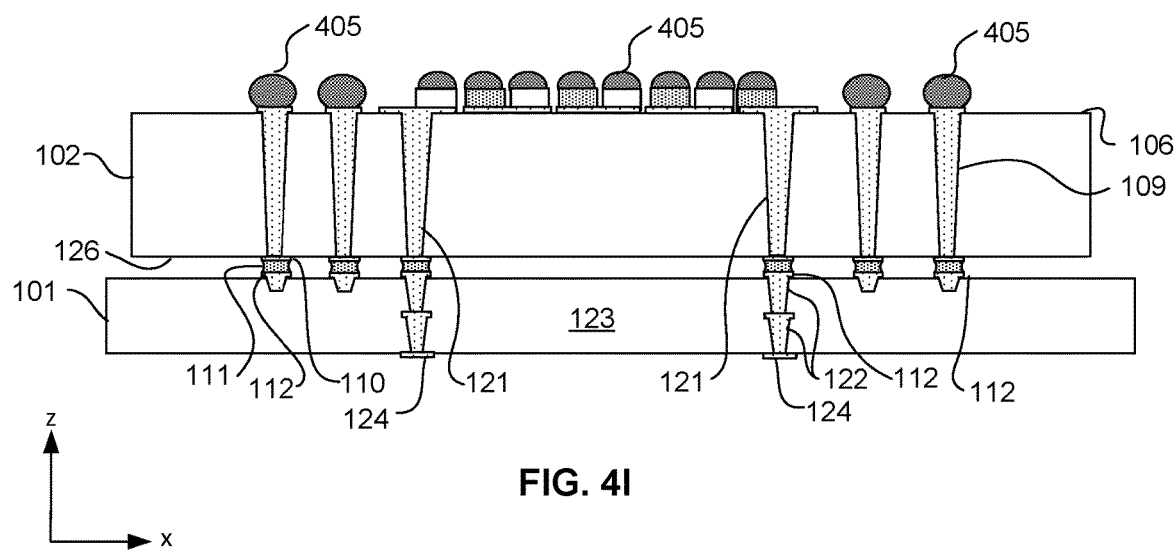

In the operation shown in FIG. 4I, solder bumps 405 are deposited over bond pads 105 and thermoelectric elements 115 and 116. Solder bumps 405 may have slightly different sizes depending on whether or not they are deposited on thermoelectric elements or bond pads 105. Solder bumps 405 may be a solder paste or a solid solder.

Figure 4J:
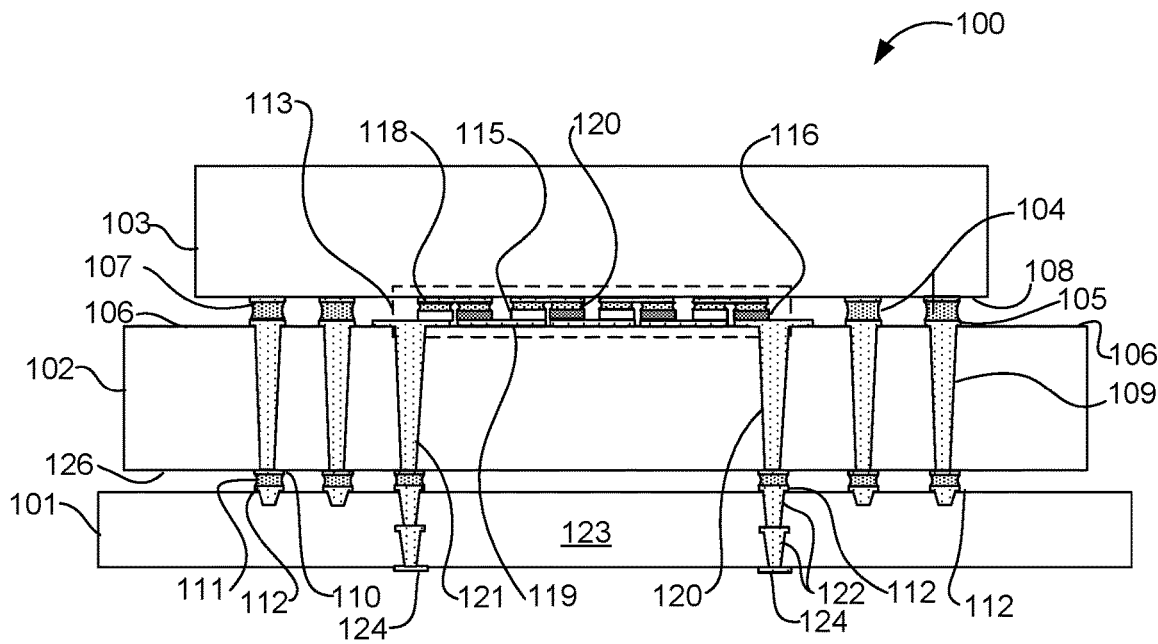

In the operation shown in FIG. 4J, upper IC die 103 is bonded to lower IC die 102. Upper IC die 103 may be attached by a flip-chip bonding process, where the front side 108 is face down over the backside 106 of lower IC die 102. Upper IC die 103 may be aligned over lower IC die 102 such that traces 118 on front side 108 (of upper IC die 103) are aligned over the thermoelectric elements. Solder bumps 405 in FIG. 4I are reflowed to form solder joints 120 between thermoelectric elements and traces 118. Formation of TEC 113 is completed in this operation.

Figure 4K:
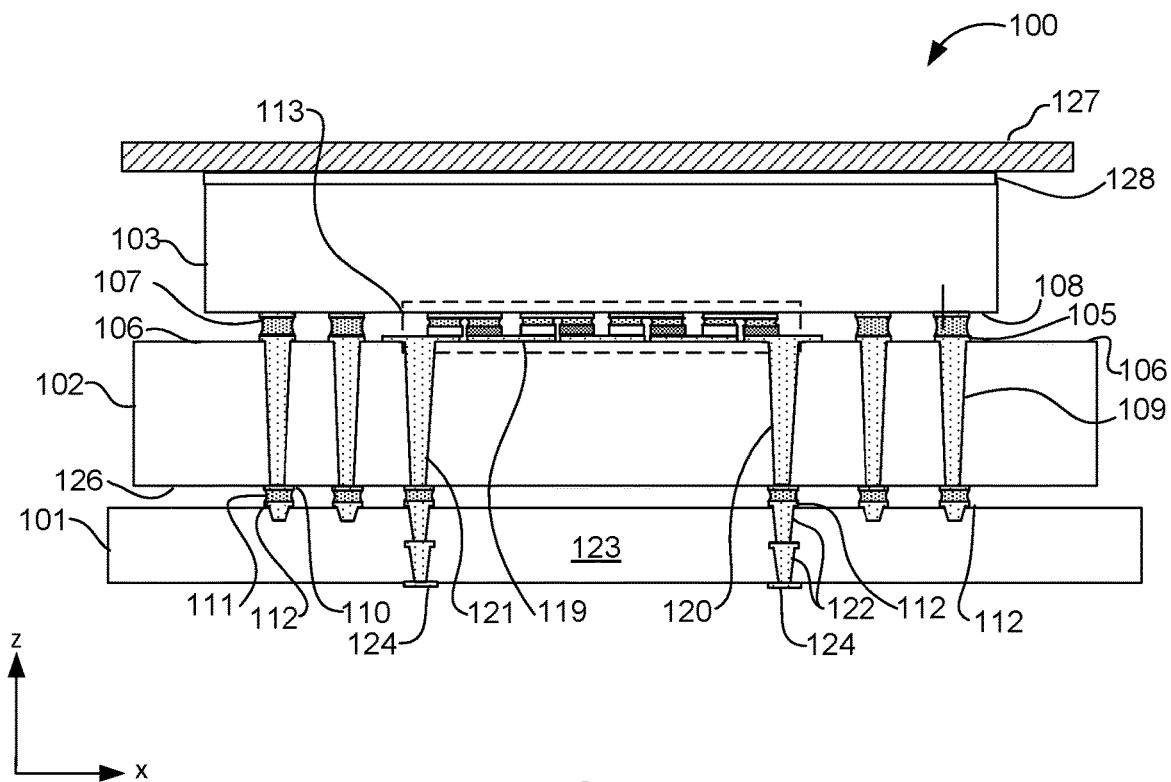

In the operation shown in FIG. 4K, IHS 127 is attached over upper IC die 103. HIS 127 may comprise sidewalls (not shown) that attach to substrate 101 by an adhesive. Before attachment of IHS 127, a TIM layer 128 is spread over upper IC die 103. In a subsequent operation, a molded encapsulant may be formed over substrate 101 and IC dice 102 and 103, completing assembly of IC package 100.

Figure 5:
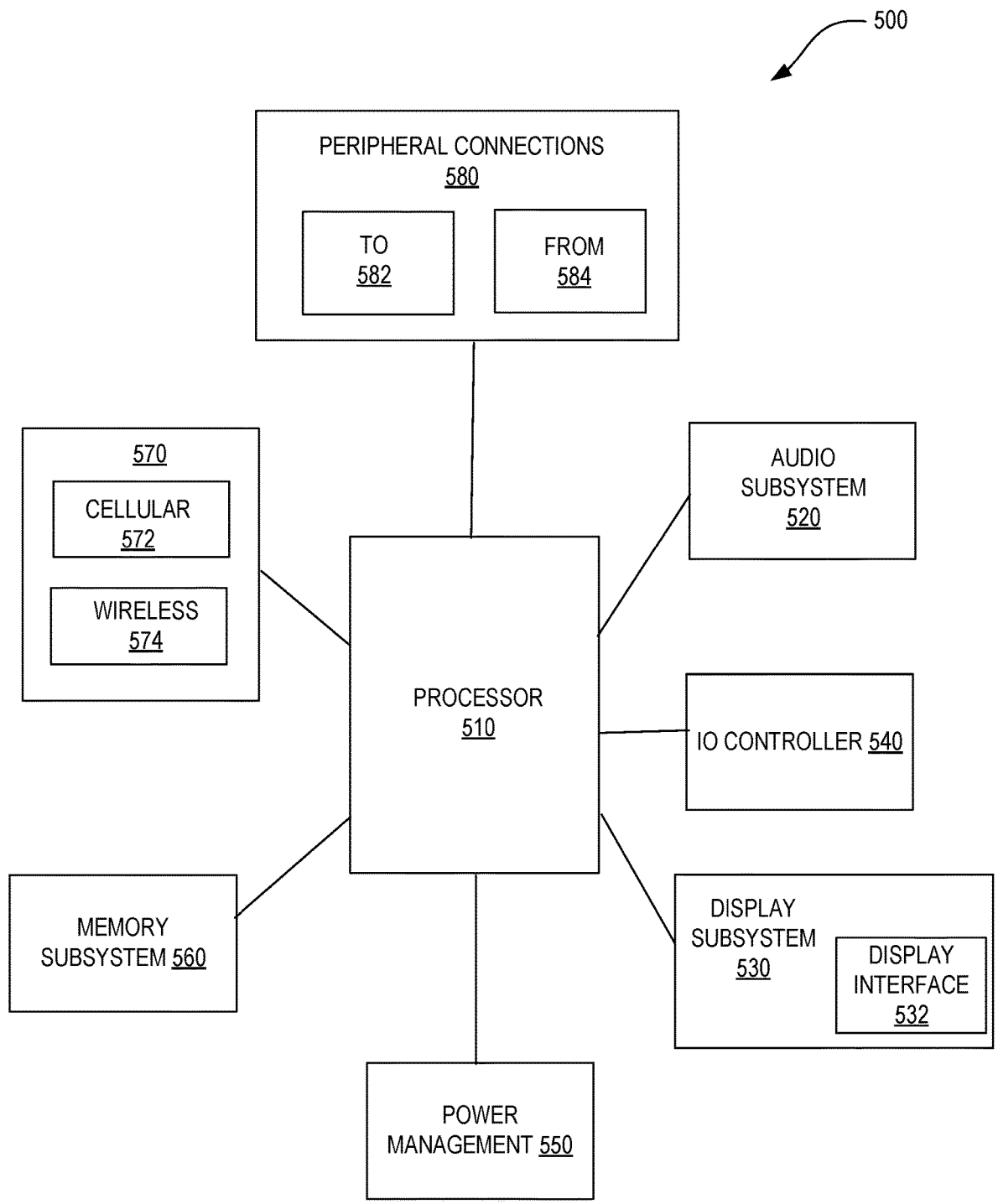
FIG. 5 illustrates a block diagram of a computing device comprising an IC package including an intra-layer thermoelectric cooler as part of a system-on-chip (SoC) package in an implementation of a computing device, according to some embodiments of the disclosure.

FIG. 5 illustrates a block diagram of computing device 500 comprising IC package 100 including an intra-layer TEC (e.g., TEC 113) as part of a system-on-chip (SoC) package in an implementation of a computing device, according to some embodiments of the disclosure.

According to some embodiments, computing device 500 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., processor 510 representing a central processing unit (CPU) or a graphical processing unit (GPU)), comprising one or more dies, is mounted on a motherboard of computing device 500. The IC package may comprise vertically integrated multiple dies or stacked individual packages in a package-on-package (PoP) architecture. In all architectures, IC packages may dissipate a large amount of heat during burst activity periods, when large computing demands are placed on the CPU or GPU. Large power dissipation results in excess heat, necessitating an enhanced thermal solution. According to some embodiments, computing device 500 employs an IC package (e.g., package 100) having a TEC integrated in the intra-layer space between vertically integrated dies, packages, or between bare die and substrate (e.g., TEC 113) mounted adjacent to the CPU or GPU and thermally coupled thereto, for example, as described above.

In some embodiments, computing device has wireless connectivity (e.g., Bluetooth and/or WiFi). It will be understood that certain components are shown generally, and not all components of such a device are shown in computing device 500.

The various embodiments of the present disclosure may also comprise a network interface within 570 such as a wireless interface so that a system embodiment may be incorporated into a wireless device, for example, cell phone or personal digital assistant.

According to some embodiments, processor 510 represents a CPU or a GPU, and can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510

Display subsystem 530 represents hardware (e.g., display devices) and software (e.g., drivers) components that provide a visual and/or tactile display for a user to interact with the computing device 500. Display subsystem 530 includes display interface 532 which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Network interface 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an IC package, comprising a first IC component comprising a first interconnect on a first surface thereof; a second IC component comprising a second interconnect on a second surface thereof, wherein the second component is above the first component, and wherein the second surface is opposite the first surface; and a thermoelectric cooling (TEC) device between the first surface and the second surface, wherein the TEC device is electrically coupled to the first interconnect and to the second interconnect.

Example 2 includes all of the features of example 1, wherein the first component is an IC device and the second component is an IC package substrate.

Example 3 includes all of the features of examples 1 or 2, wherein the first component is a first IC device and the second component is a second IC device.

Example 4 includes all of the features of any one of examples 1 to 3, wherein the first interconnect and the second interconnect comprise copper or gold.

Example 5 includes all of the features of any one of examples 1 to 4, wherein the TEC device comprises a thermoelectric material that has first interface on a first side with the first interconnect on the first component, and a second interface on a second side with a solder feature on the second side, and wherein the solder feature is bonded to the second interconnect on the second component.

Example 6 includes all of the features of example 5, wherein the thermoelectric material comprises a first island comprising a n-type material and a second island comprising a p-type material, wherein the first island is adjacent to the second island, wherein the first island has a direct interface with a first trace on the first component, and the second island has a direct interface with a second trace on the first component, wherein a first solder feature is on the first island, and a second solder feature is on the second island, and wherein the first solder feature and the second solder feature are bonded to a third trace on the second component.

Example 7 includes all of the features of example 6, wherein the first trace has first thickness, and the second trace has a second thickness, and wherein the first thickness is unequal to the second thickness.

Example 8 includes all of the features of any one of examples 1 to 7, wherein the TEC device has a first junction on a first side, wherein the first junction comprises a thermoelectric material has a direct interface with a first solder feature bonded to the first interconnect on the first component, and a second junction on the second side, wherein the second junction comprises the thermoelectric material has a direct interface with a second solder feature bonded to the second interconnect on the second component.

Example 9 includes all of the features of example 8, wherein the thermoelectric material comprises a first island comprising a n-type material and a second island comprising a p-type material, wherein the first island is adjacent to the second island, wherein the first island is between a first solder feature and a second solder feature, and the second island is between a third solder feature and a fourth solder feature, wherein the first solder feature is bonded to a first trace on the first component, and the third solder feature is bonded to a second trace on the first component, and wherein the second solder feature and the fourth solder feature are bonded to a third trace on the second component.

Example 10 includes all of the features of any one of examples 1 to 9, wherein the TEC device comprises a first island comprising a n-type thermoelectric material and a second island comprising a p-type thermoelectric material, wherein the first island is adjacent to the second island, and wherein the first island has a direct interface with a first trace on the first component, and a second island has a direct interface with a second trace on the second component.

Example 11 includes all of the features of example 10, wherein a first solder feature is between the first island and the second trace, wherein a second solder feature is between the second island and a third trace on the first component, and wherein the first island is bonded to the second trace by the first solder feature, and the second island is bonded to the third trace by the second solder feature.

Example 12 includes all of the features of example 11, wherein the first island is electrically coupled to the second island by the third trace.

Example 13 includes all of the features of any one of examples 1 to 12, wherein the thermoelectric material comprises any one of bismuth, tellurium, selenium, antimony, phosphorus, arsenic, lead, gallium, tin, indium, zinc, cobalt, copper, nickel, iron, vanadium, iridium, zirconium, niobium, lanthanum, neodymium, samarium, gold, barium, strontium, titanium, silicon, germanium or oxygen.

Example 14 includes all of the features of any one of examples 1 to 13, wherein the TEC device has a thickness of 50 microns or less.

Example 15 includes all of the features of any one of examples 1 to 14, wherein the TEC device comprises two or more thermoelectric elements, wherein the two or more thermoelectric elements have a thickness ranging between 5 microns and 100 microns.

Example 16 includes all of the features of any one of examples 1 to 15, wherein the TEC device comprises two or more thermoelectric elements have a diameter ranging between 20 microns and 1000 microns.

Example 17 is a system comprising an IC package coupled to a printed circuit board, the IC package comprising a memory and a microprocessor coupled to the memory, the IC package comprising a first IC component comprising a first interconnect on a first surface thereof; a second IC component comprising a second interconnect on a second surface thereof, wherein the second component is above the first component, and wherein the second surface is opposite the first surface; and a thermoelectric cooling (TEC) device between the first surface and the second surface, wherein the TEC device is electrically coupled to the first interconnect and to the second interconnect; a power source coupled to the printed circuit board; and a controller coupled to the TEC device.

Example 18 includes all of the features of example 17, wherein the controller is coupled to the printed circuit board.

Example 19 includes all of the features of examples 17 or 18, wherein the controller is coupled to a temperature sensor adjacent to the TEC device.

Example 20 includes all of the features of example 19, wherein the temperature sensor is integrated within the microprocessor.

Example 21 is a method for making an IC package, comprising forming a interconnect on a first component of the IC package; depositing a layer comprising a first thermoelectric material over the plurality or traces; depositing a first photoresist layer over the first thermoelectric material; patterning openings in the first photoresist layer over first traces of the interconnect, wherein the first traces are exposed and second traces of the interconnect are masked, wherein the first traces are adjacent to the second traces; removing exposed islands of the first thermoelectric material; depositing a layer comprising a second thermoelectric material over the first photoresist layer; depositing a second photoresist layer over the second thermoelectric material; patterning openings in the second photoresist layer over the second traces, wherein the second traces are exposed and the first traces are masked; removing exposed islands of the second thermoelectric material; and removing the first photoresist layer and the second photoresist layer.

Example 22 includes all of the features of example 21, wherein depositing the layer comprising the first thermoelectric material comprises electroplating the first thermoelectric material over the plurality of traces.

Example 23 includes all of the features of any one of examples 21 or 22, wherein depositing the layer comprising a first thermoelectric material comprises depositing the first thermoelectric material by chemical vapor deposition over the plurality of traces.

Example 24 includes all of the features of any one of examples 21 to 23, wherein depositing the layer comprising the first thermoelectric material comprises spreading a paste comprising the first thermoelectric material over the plurality of traces.

Example 25 includes all of the features of any one of examples 21 to 24, wherein the paste comprising the first thermoelectric material of the plurality of traces is heat treated.

An abstract is submitted with the understanding that it will not be used to limit the scope or meaning of the claims. The following claims are hereby incorporated into the detailed description, with each claim standing on its own as a separate embodiment.

We claim:

1. An IC package, comprising:
 a first IC component comprising a plurality of first interconnects on a first surface of an IC die;
 a second IC component comprising a plurality of second interconnects on a second surface thereof, wherein the second surface is opposite the first surface and wherein the second IC component is electrically coupled to the first IC component through a plurality of electrically conductive joints between the first interconnects and the second interconnects; and
 a thermoelectric cooling (TEC) device between the first surface and the second surface and laterally adjacent to the joints, wherein the TEC device comprises a thermoelectric material that has a first interface with a first trace on the first IC component.

2. The IC package of claim 1, wherein the second IC component is an IC package substrate.

3. The IC package of claim 1, wherein the first IC component is a first IC device and the second IC component is a second IC device.

4. The IC package of claim 1, wherein the electrically conductive joints each comprise a solder feature.

5. The IC package of claim 1, wherein the thermoelectric material has a second interface with a solder feature bonded to the second IC component.

6. The IC package of claim 5, wherein the thermoelectric material comprises a first island comprising a n-type material and a second island comprising a p-type material, wherein the first island is adjacent to the second island, wherein a first solder feature is on the first island, and a second solder feature is on the second island, and wherein the first solder feature and the second solder feature are bonded to the second IC component.

7. The IC package of claim 6, wherein the first island has a direct interface with the first trace, and the second island has a direct interface with a second trace on the first IC component, and wherein the first trace has a first thickness, and the second trace has a second thickness, and wherein the first thickness is unequal to the second thickness.

8. The IC package of claim 1, wherein the TEC device comprises a first island comprising a n-type thermoelectric material and a second island comprising a p-type thermoelectric material, wherein the first island is adjacent to the second island, and wherein the first island has a direct interface with the first trace on the first IC component, and a second island has a direct interface with a second trace on the second IC component.

9. The IC package of claim 8, wherein a first solder feature is between the first island and the second trace, wherein a second solder feature is between the second island and a third trace on the first IC component, and wherein the first island is bonded to the second trace by the first solder feature, and the second island is bonded to the third trace by the second solder feature.

10. The IC package of claim 9, wherein the first island is electrically coupled to the second island by the third trace.

11. The IC package of claim 1, wherein the thermoelectric material comprises any one of bismuth, tellurium, selenium, antimony, phosphorus, arsenic, lead, gallium, tin, indium, zinc, cobalt, copper, nickel, iron, vanadium, iridium, zirconium, niobium, lanthanum, neodymium, samarium, gold, barium, strontium, titanium, silicon, germanium or oxygen.

12. The IC package of claim 1, wherein the TEC device has a thickness of 50 microns or less.

13. A system comprising:
 an IC package coupled to a printed circuit board, the IC package comprising a memory and a microprocessor coupled to the memory, the IC package comprising:
 a first IC component comprising a plurality of first interconnects on a first surface of an IC die;
 a second IC component comprising a plurality of second interconnects on a second surface thereof, wherein the second surface is opposite the first surface and wherein the second IC component is electrically coupled to the first IC component through a plurality of electrically conductive joints between the first interconnects and the second interconnects; and
 a thermoelectric cooling (TEC) device between the first surface and the second surface and laterally adjacent to the joints, wherein the TEC device comprises a thermoelectric material that has a first interface with a first trace on the first component;
 a power source coupled to the printed circuit board; and
 a controller coupled to the TEC device.

14. The system of claim 13, wherein the controller is coupled to the printed circuit board.

15. The system of claim 13, wherein the controller is coupled to a temperature sensor adjacent to the TEC device.

* * * * *